United States Patent [19]

Fujita

[11] Patent Number: 4,479,067
[45] Date of Patent: Oct. 23, 1984

[54] OUTPUT BUFFER CIRCUIT

[75] Inventor: Kouichi Fujita, Yokohama, Japan

[73] Assignee: Fujitsu Limited, Kawasaki, Japan

[21] Appl. No.: 296,311

[22] Filed: Aug. 26, 1981

[30] Foreign Application Priority Data

Aug. 29, 1980 [JP] Japan ................. 55-119360

[51] Int. Cl.³ ............... H03K 17/04; H03K 19/017; H03K 17/693

[52] U.S. Cl. ............................... 307/475; 307/448; 307/581

[58] Field of Search ............... 307/475, 450, 440, 448, 307/239, 248, 571, 572, 577, 581, 584, 299 R, 270, 273; 365/194, 203

[56] References Cited

U.S. PATENT DOCUMENTS

| 3,993,954 | 11/1976 | Sugai | 307/445 X |
| 4,000,429 | 12/1976 | Yoshida et al. | 307/450 X |
| 4,028,682 | 6/1977 | Weber et al. | 340/172.5 |
| 4,153,933 | 5/1979 | Blume, Jr. | 364/200 |

FOREIGN PATENT DOCUMENTS 2851825 4/1980 Fed. Rep. of Germany .

OTHER PUBLICATIONS

Radio Fernsehen Elektronik, vol. 26, No. 6, 1977, pp. 187–188, 197–198, Berlin D. D., M. Hohne, "Der Mikroprozessor U808 D", FIG. 7 on p. 188.

Primary Examiner—Larry N. Anagnos
Assistant Examiner—David R. Bertelson
Attorney, Agent, or Firm—Staas & Halsey

[57] ABSTRACT

An output buffer circuit for use in a bidirectional input-/output circuit comprising an inverter circuit including a pull-up load and a driver transistor, and a charging circuit for charging an external input/output line for a predetermined time-period when the falling of the potential of an internal output line is detected.

15 Claims, 12 Drawing Figures

OUTPUT BUFFER CIRCUIT

BACKGROUND OF THE INVENTION

The present invention relates to an output buffer circuit for use in a bidirectional input/output circuit which is, for example, used in an input/output port of a microcomputer or the like.

An integrated circuit, such as a microcomputer, requires a large number of input terminals and a large number of output terminals; however, in order to reduce the number of such terminals, bidirectional input/output circuits are provided. Usually, one bidirectional input/output circuit comprises an output buffer circuit, an input buffer circuit and an input/output terminal to which the output buffer circuit and the input buffer circuit are commonly connected. In this case, an internal output signal generated from the interior of the integrated circuit is transmitted through the output buffer circuit and the input/output terminal to an external load, while an external input signal generated from the exterior of the integrated circuit is transmitted through the input/output terminal and the input buffer circuit to the interior of the integrated circuit.

A first conventional output buffer circuit for use in a bidirectional input/output circuit comprises an inverter circuit. The inverter circuit is formed by a depletion type MOS (broadly, MIS) transistor which serves as a pull-up load and an enhancement type MOS transistor which serves as a driver. In this case, the pull-up resistance of the pull-up transistor is much larger than the on-state resistance of the driver transistor. However, in this output buffer circuit, due to the high resistance of the pull-up transistor and the large external load capacitor there is a disadvantage in that the rising of an external output signal is slow.

A second conventional output buffer circuit for use in a bidirectional input/output circuit comprises an off-buffer circuit instead of the pull-up depletion type transistor of the first conventional output buffer circuit. The off-buffer circuit includes an inverter circuit and a pull-up enhancement type MOS transistor. In this case, it is unnecessary to consider a ratio of the on-state resistances of the two enhancement type transistors. According to the second conventional output buffer circuit, the slow rising of an external output signal is considerably improved; however, since one of the two enhancement type transistors is always turned on, the output buffer circuit is in a low-impedance state from the side of the input/output terminal, which increases the load of the input buffer circuit. Therefore, the second output buffer circuit is not suitable for a bidirectional input/output circuit.

A third conventional output buffer circuit for use in a bidirectional input/output circuit comprises two enhancement type MOS transistors in addition to the second conventional circuit having an off-buffer circuit, so as to improve the low-impedance of the second conventional circuit. However, this third conventional circuit requires a control circuit for controlling the two additional transistors so that the control thereof is complex.

SUMMARY OF THE INVENTION

It is an object of the present invention to provide an output buffer circuit for use in a bidirectional input/output circuit, permitting a fast rise of an external output signal and having a high-impedance without necessitating a complex control signal or circuit.

It is another object of the present invention to provide a bidirectional input/output circuit including such an output buffer circuit.

According to the present invention, there is provided an output buffer circuit for converting an internal output signal into an external output signal including: first and second power supplies, an internal output line for receiving the internal output signal and an external output line for generating the external output signal. Also included is a pull-up load connected to the first power supply and to the external output line. Furthermore, a first MIS transistor is included having a drain connected to the external output line, a source connected to the second power supply and a gate connected to the internal output line. Additionally, means, connected to the internal output line and to the external output line, is included for charging the external output line for a predetermined time-period when the state of said first MIS transistor is changed from the on-state to the off-state.

According to the present invention there is also provided a bidirectional input/output circuit including first and second power supplies, an internal output line; an internal input line, an external input/output line and an external terminal connected to the external input/output line. Also included is an output buffer circuit connected to the internal output line and to the external input/output line, and an input buffer circuit connected to the external input/output line and to the internal input line. The output buffer circuit includes a pull-up load connected to the first power supply and to the external input/output line. The first MIS transistor having a drain connected to the external input/output line, a source connected to the second power supply and a gate connected to the internal output line. Furthermore, means, connected to the internal output line and to the external input/output line, is included for charging the external input/output line for a predetermined time period when the first MIS transistor is changed from the on-state to the off-state.

The present invention will be more clearly understood from the following description contrasted with the conventional circuits and with reference to the accompanying drawings.

DESCRIPTION OF THE PREFERRED EMBODIMENT

Figure 1:
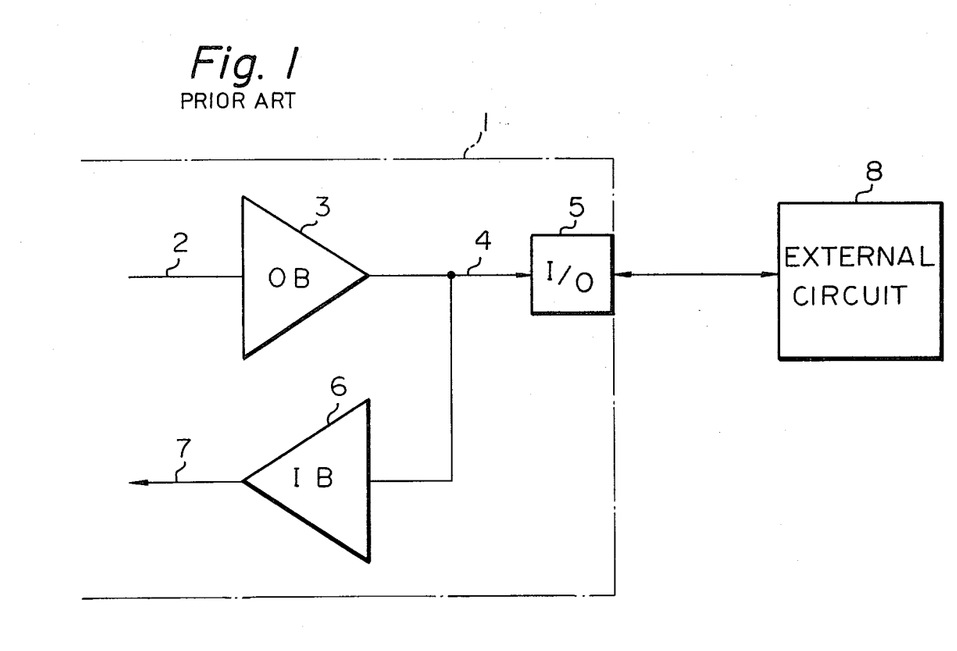
FIG. 1 is a block diagram illustrating a general bidirectional input/output circuit.

In FIG. 1, which illustrates a general bidirectional input/output circuit, 1 is an integrated circuit chip; 2 is an internal output line; 3 is an output buffer circuit; 4 is an external input/output line; 5 is an external input/output terminal; 6 is an input buffer circuit; 7 is an internal input line; and 8 is an external circuit. A bidirectional input/output circuit comprises elements 2 through 7. In this case, an internal signal generated from the interior of the integrated circuit chip 1 is transmitted from the internal output line 2 through the output buffer circuit 3, the external input/output line 4 and the external input/output terminal 5 to the external circuit 8. An external signal generated from the external circuit 8 is transmitted through the external input/output terminal 5, the external input/output line 4, the input buffer circuit 6 and the internal input line 7 to the interior of the integrated circuit chip 1.

Figure 2:
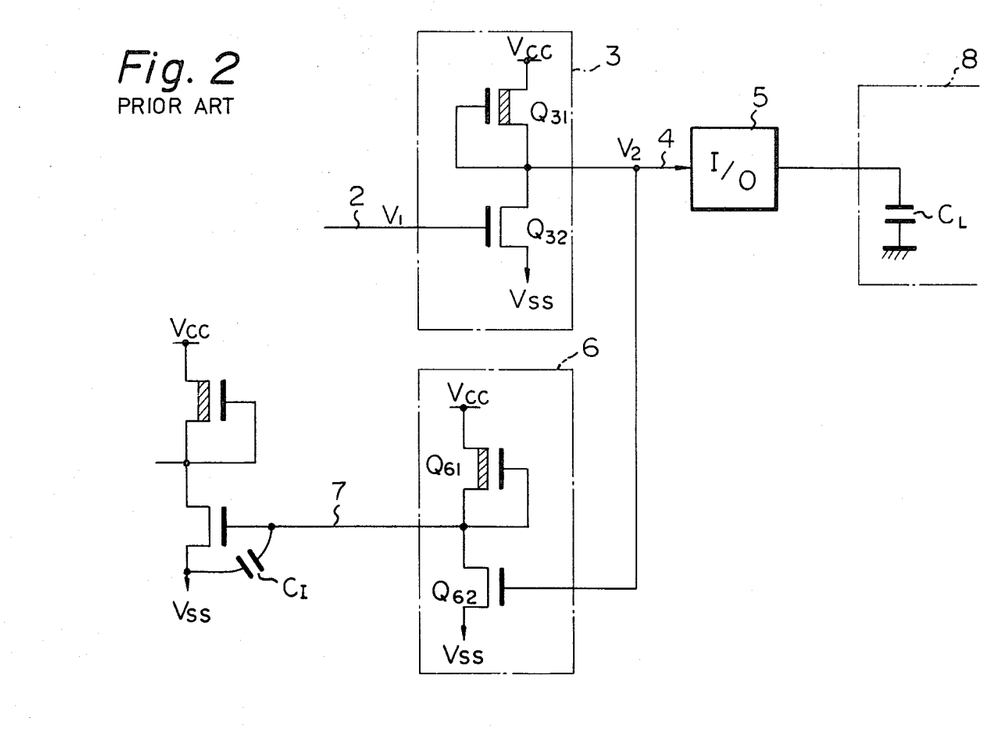
FIG. 2 is a circuit diagram illustrating a first conventional output buffer circuit for use in a bidirectional input/output circuit.

FIG. 2 is a circuit diagram illustrating a first conventional output buffer circuit for use in a bidirectional input/output circuit. In FIG. 2, the output buffer circuit 3 comprises an inverter circuit, in which a depletion type MOS transistor $Q_{31}$ connected to a power supply $V_{CC}$, which serves as a pull-up load, and an enhancement type MOS transistor $Q_{32}$ connected to another power supply $V_{SS}$, which serves as a driver, are connected in series. Similarly, the input buffer circuit 6 comprises an inverter circuit, in which a depletion type MOS transistor $Q_{61}$ and an enhancement type MOS transistor $Q_{62}$ are connected in series.

Figure 3A:
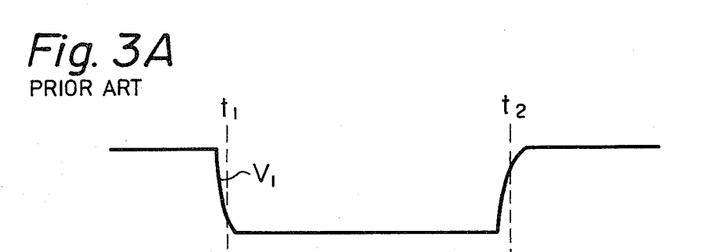
FIGS. 3A and 3B are timing diagrams of signals appearing in the circuit of FIG. 2.
Figure 3B:
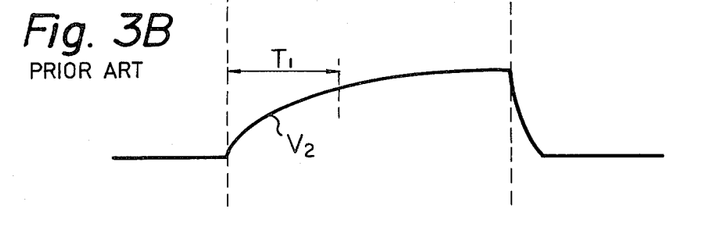

FIGS. 3A and 3B are timing diagrams of the signals appearing in the circuit of FIG. 2. Referring to FIGS. 3A and 3B, the operation of the circuit of FIG. 2, that is, the output buffer circuit 3 will now be explained. At a time $t_1$, when the potential $V_1$ at the internal output line 2 is changed from high to low, as illustrated in FIG. 3A, the transistor $Q_{32}$ cuts off so that the potential at the external input/output line 4 is changed from low to high. As a result, an external load capaciter $C_L$ of the external circuit 8 is charged. However, in this case, since the pull-up resistance of the transistor $Q_{31}$ which is, for example, on the order of kΩ is much larger than the on-state resistance of the transistor $Q_{32}$ and, in addition, the capacitor $C_L$ is usually large, that is, 50 to 100 pF, and therefore, the rising of the potential $V_2$ is slow, as illustrated in FIG. 3B. For example, the rising time $T_1$ is on the order of 100 nsec. Next, at a time $t_2$, when the potential $V_1$ at the internal output line 2 is changed from low to high, as illustrated in FIG. 3A, the transistor $Q_{32}$ is turned on so that the potential $V_2$ rapidly falls, as illustrated in FIG. 3B.

Thus, in the output buffer circuit 3 of FIG. 2, there is a problem in that the rising of the potential $V_2$ of an external output signal is slow. In order to solve such a problem, one approach is to reduce both the on-state resistances of the transistors $Q_{31}$ and $Q_{32}$; however, in this situation, the areas of the transistors $Q_{31}$ and $Q_{32}$ are increased, which is not practical in a design for integrated circuits.

On the other hand, when the input buffer circuit 6 is used the potential $V_1$ at the internal output line 2 is usually low, so that the output buffer circuit 3 is in a high-impedance state as seen from the side of the external input/output terminal 5. In addition, the effective capacitance $C_I$ of the internal circuit of the integrated circuit chip 1 is very small, that is, generally 0.01 to 0.1 pF, so that the rising of the potential at the internal input line 7 is not as slow as that of the potential $V_2$ in the case of the output operation. Note that this rising time is usually about 10 nsec.

Figure 4:
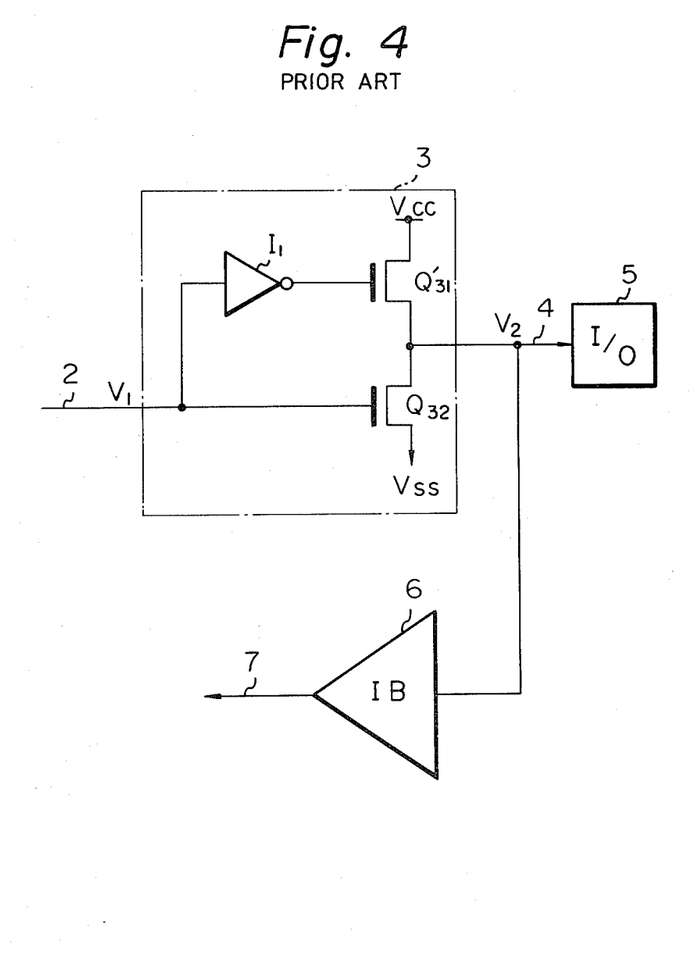
FIGS. 4 and 5 are circuit diagrams illustrating second and third conventional output buffer circuits for use in a bidirectional input/output circuit, respectively.

FIG. 4 is a circuit diagram illustrating a second conventional output buffer circuit for use in a bidirectional input/output circuit. In FIG. 4, an enhancement type MOS transistor $Q_{31}'$ and an inverter circuit $I_1$, which serve as an off-buffer circuit, are provided instead of the depletion type MOS transistor $Q_{31}$ of FIG. 2. In FIG. 4, when the potential $V_1$ at the internal output line 2 is changed from high to low, the transistor $Q_{32}$ cuts off and in addition, the transistor $Q_{31}'$ is turned on due to the high potential level of the output of the inverter circuit $I_1$. As a result, the potential $V_2$ at the external input/output line 4 rises rapidly. However, when the potential $V_1$ at the internal output line 2 is changed from low to high, the transistor $Q_{32}$ is turned on and the transistor $Q_{31}'$ cuts off due to the low potential level of the output of the inverter circuit $I_1$. As a result, the potential $V_2$ at the external input/output line 4 falls rapidly. In this case, as is different from FIG. 2, since it is unnecessary to consider a ratio of the on-state resistance of the transistor $Q_{31}'$ to that of the transistor $Q_{32}$, the on-state resistance of the transistor $Q_{31}'$ can be reduced regardless of the transistor $Q_{32}$. Therefore, when considering only the output buffer circuit 3, it is possible for the slow rising of the potential of the output thereof to be considerably inproved.

However, when considering the input buffer circuit 6, one of the transistors $Q_{31}'$ and $Q_{32}$ is always turned on, so that the output buffer circuit 3 is always in a low-impedance state as seen from the external input/output terminal 5. As a result, the load of the input buffer circuit 6 becomes large. Therefore, the on-state resistance of the transistor $Q_{31}'$ cannot be reduced. This means that the output buffer circuit 3 of FIG. 4 is not suitable for a bidirectional input/output circuit.

Figure 5:
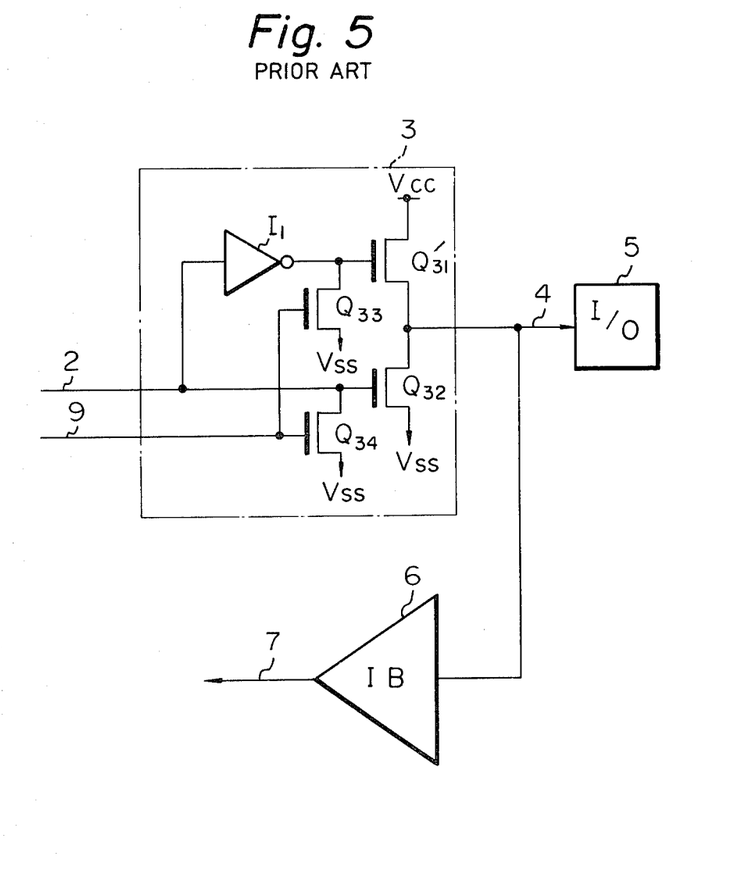

FIG. 5 is a circuit diagram illustrating a third conventional output buffer circuit. In FIG. 5, two enhancement type transistors $Q_{33}$ and $Q_{34}$ are added to the output buffer circuit 3 of FIG. 4 having an off-buffer circuit. In order to improve the low-impedance of the output buffer circuit 3, when the input buffer circuit 6 is used the potential at a control line 9 is forced to be high to turn on the transistors $Q_{33}$ and $Q_{34}$. As a result, both transistors $Q_{31}'$ and $Q_{32}$ are turned off so that the output buffer circuit 3 becomes a high-impedance state as seen from the side of the external input/output terminal 5. However, the circuit of FIG. 5 requires a circuit for controlling the potential at the control line 9, so that this circuit is not practical due to the complexity of input and output control.

Figure 6:
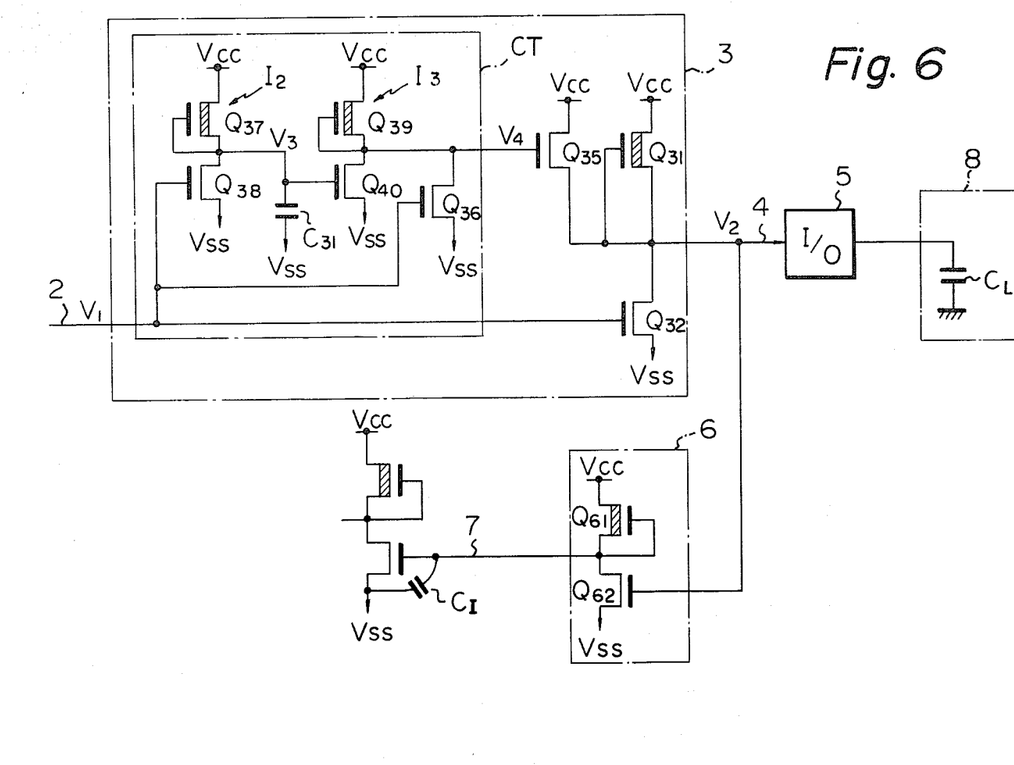
FIG. 6 is a circuit diagram illustrating an embodiment of the output buffer circuit for use in a bidirectional input/output circuit according to the present invention.

FIG. 6 is a circuit diagram illustrating an embodiment of the output buffer circuit for use in a bidirectional input/output circuit according to the present invention. In FIG. 6, a charging circuit formed by a charging transistor $Q_{35}$ which has a sufficiently small on-state resistance and a pulse generating circuit CT is added to the output buffer circuit 3 of FIG. 2. The pulse generating circuit CT generates a pulse having a predetermined time-period when the potential $V_1$ or signal at the internal output line 2 falls.

The pulse generating circuit CT will be explained in more detail. The pulse generating circuit CT comprises two inverter circuits $I_2$ and $I_3$ connected in series, a capacitor $C_{31}$ between the inverter circuits $I_2$ and $I_3$, and an enhancement type MOS transistor $Q_{36}$ connected to the output of the inverter circuit $I_3$. In this case, the inverter circuit $I_2$ comprises a depletion type MOS transistor $Q_{37}$ and an enhancement type MOS transistor $Q_{38}$ connected in series, while the inverter circuit $I_3$ comprises a depletion type MOS transistor $Q_{39}$ and an enhancement type MOS transistor $Q_{40}$ connected in series.

Figure 7A:
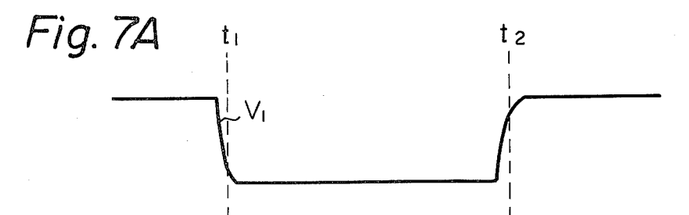
FIGS. 7A through 7D are timing diagrams of signals appearing in the circuit of FIG. 6.
Figure 7B:
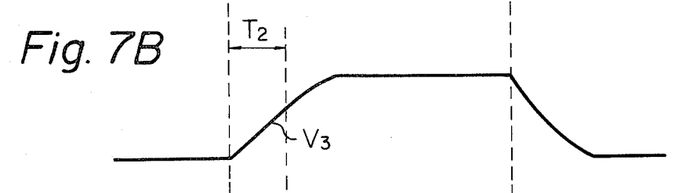
Figure 7C:
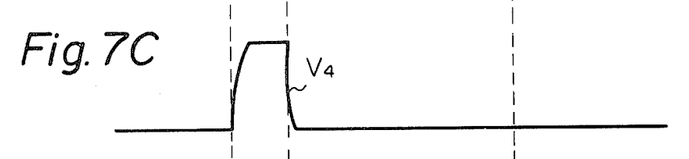
Figure 7D:
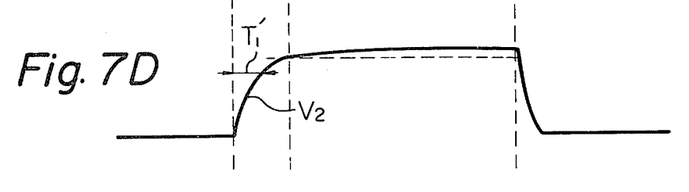

FIGS. 7A through 7D are timing diagrams of signals appearing in the circuit of FIG. 6. The operation of the circuit of FIG. 6 will be explained with reference to FIGS. 7A through 7D. Before a time $t_1$, when the potential at the internal output line 2 is high, as illustrated in FIG. 7A, the transistors $Q_{32}$ and $Q_{38}$ are turned on and, accordingly, the transistor $Q_{40}$ is turned on. As a result, the potential $V_4$ is low, as illustrated in FIG. 7C, so that the charging transistor $Q_{35}$ does not operate. Next, at the time $t_1$, when the potential $V_1$ at the internal output line 2 is changed from high to low, as illustrated in FIG. 7A, all the transistors $Q_{32}$, $Q_{36}$, $Q_{38}$ and $Q_{40}$ are turned off. At this time, after the transistor $Q_{38}$ is turned off, the potential $V_3$ at the output of the inverter circuit $I_2$ is expected to be pulled up to a high level by charging the capacitor $C_{31}$ through the transistor $Q_{37}$; however, in this case, as illustrated in FIG. 7B, the potential $V_3$ has a delay time $T_2$ due to the resistance of the transistor $Q_{37}$ and the capacity of the capacitor $C_{31}$. As a result, the transistor $Q_{40}$ remains in an off-state for the time-period $T_2$ an accordingly, the potential $V_4$ at the output of the circuit CT also remains at a high level, as illustrated in FIG. 7C, to turn on the charging transistor $Q_{35}$. As a result, the potential $V_2$ at the input/output line 4 rapidly rises as illustrated in FIG. 7D. In this case, the rising time $T_1'$ is on the order of 10 nsec. After the time-period $T_2$ passes, the transistor $Q_{40}$ is turned on so that the potential $V_4$ rapidly falls, as illustrated in FIG. 7C, to cut off the transistor $Q_{35}$. As a result, the potential $V_2$ gradually rises to the level $V_{CC}$ through the pull-up transistor $Q_{31}$, as illustrated in FIG. 7D.

Next, at a time $t_2$, when the potential $V_1$ is changed from low to high, the transistor $Q_{36}$ is turned on, so that the transistor $Q_{35}$ does not conduct. That is, in this case, the same falling characteristics as FIG. 2 are obtained.

Thus, the pulse generating circuit CT detects a falling of potential $V_1$ at the internal output line 2, that is, a change of the transistor $Q_{32}$ from the on-state to the off-state, and as a result, generates a pulse, having a predetermined time-period $T_2$ (about 10 to 100 nsec), to the charging transistor $Q_{35}$. As a result, the external input/output line 4 is charged by the low-resistance transistor $Q_{35}$ and the high-resistance transistor $Q_{31}$ for the time-period $T_2$ and after that, the input/output line 4 is pulled up to the level $C_{cc}$ by the high-resistance transistor $Q_{31}$.

On the other hand, when the input buffer circuit 6 is used, the potential $V_1$ at the internal output line 2 is caused to be low to turn off the transistor $Q_{32}$; however, in this case, the transistors $Q_{40}$ and $Q_{35}$ are turned on and off, respectively, and accordingly, the output buffer circuit 3 is in a high-impedance state as seen from the side of the external input/output terminal 5. Therefore, when an external input signal generated from the external circuit 8 is transmitted from the external input/output terminal 5 to the input buffer circuit 6, the load thereof is small. In addition, a control method for such an input operation is effected by only causing the potential $V_1$ at the internal output line to be low.

In FIG. 6, all the transistors are of an n-channel type; however, it should be noted that these transistors can be of a p-channel type. In this case, at the time $t_1$, the potential at the internal output line 2 is changed from low to high.

Figure 8:
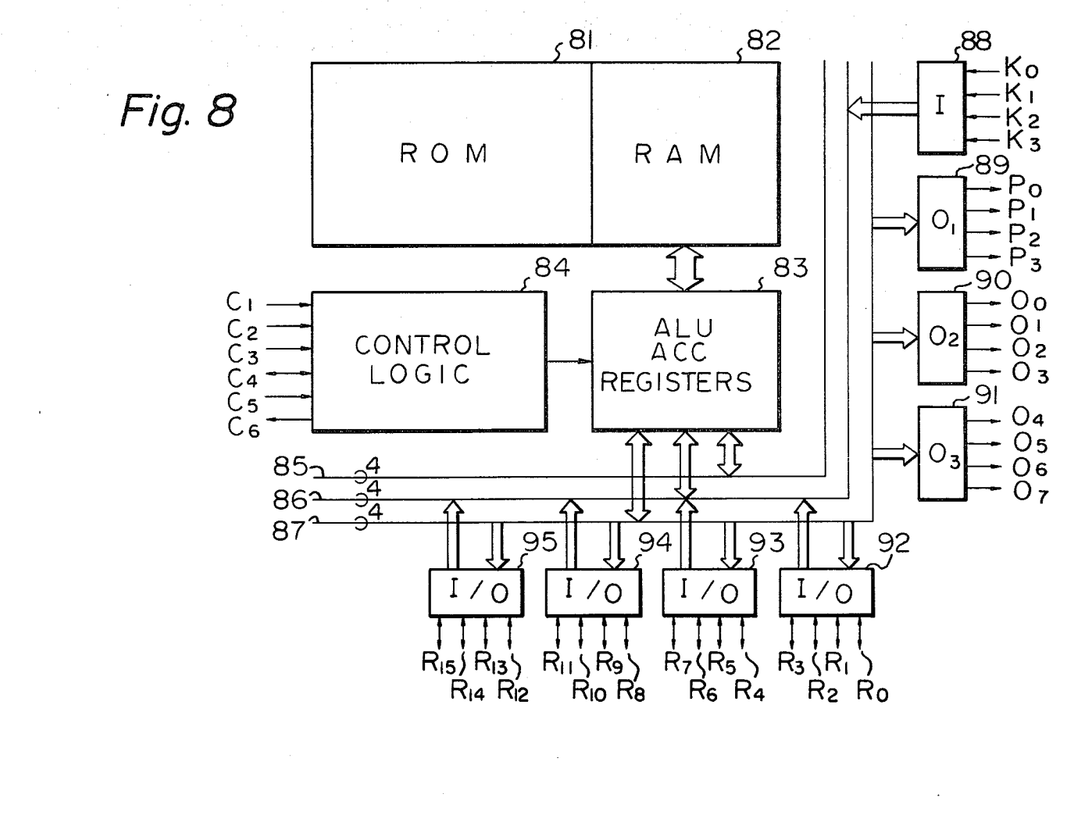
FIG. 8 is a block diagram illustrating a one-chip microcomputer to which the output buffer circuit for use in a bidirectional input/output circuit according to the present invention is applied.

FIG. 8 is a block diagram illustrating a one-chip microcomputer to which the output buffer circuit for use in a bidirectional input/output circuit according to the present invention is applied. In FIG. 8, 81 is a read-only memory (ROM); 82 is a random-access memory (RAM); 83 is an arithmetic and logic unit (ALU) and the like; and 84 is a control logic unit for receiving control signals $C_1$ through $C_6$ and controlling the ALU 83. These elements 81 through 84 are surrounded by three data buses 85, 86 and 87 which are connected to an input port 88, output ports 89, 90 and 91, and input/output ports 92, 93, 94 and 95. Four output buffer circuits according to the present invention are used in each of the input/output ports 92, 93, 94 and 95.

As explained hereinbefore, the output buffer circuit for use in a bidirectional input/output circuit according to the present invention has an advantage, as compared with the conventional circuits, in that the rising characteristic of an external output signal is improved and a high-impedance is obtained without complex controls when the input buffer circuit is used.

I claim:

1. An output buffer circuit for converting an internal output signal into an external output signal, comprising:
    first and second power supplies;
    an internal output line for receiving said internal output signal;
    an external output line for outputting said external output signal;
    a pull-up load operatively connected to said first power supply and to said external output line;
    a first transistor having a drain operatively connected to said external output line, a source operatively connected to said second power supply and a gate operatively connected to said internal output line; and
    means, operatively connected to said internal output line and to said external output line, for charging said external output line for a predetermined time-period when a state of said first transistor is changed from an on-state to an off-state, said means for charging comprising:
        a second transistor having a drain operatively connected to said first power supply, a source operatively connected to said external output line and a gate;
        a third transistor having a drain operatively connected to the gate of said second transistor, a source operatively connected to said second power supply, and a gate operatively connected to said internal output line; and
        a delay circuit operatively connected between said internal output line and the gate of said second transistor.

2. An output buffer circuit as set forth in claim 1, wherein said pull-up load comprises a depletion type source gate connected transistor operatively connected between said first power supply and said external output line.

3. An output buffer circuit as set forth in claim 1, wherein said delay circuit comprises:
    a first inverter circuit having an input operatively connected to said internal output line and having an output;

a capacitor having an electrode operatively connected to the output of said first inverter circuit and having another electrode operatively connected to said second power supply; and a second inverter circuit having an input operatively connected to the output of said first inverter circuit and having an output operatively connected to the gate of said second transistor.

4. An output buffer circuit as set forth in claim 3, wherein each of said first and second inverter circuits comprises a depletion type transistor and an enhancement type transistor connected in series.

5. An output buffer circuit as set forth in claim 3, wherein said first, second and third transistors are of an enhancement type.

6. A bidirectional input/output circuit, comprising:
first and second power supplies;
an internal output line;
an internal input line;
an external input/output line;
an external input/output terminal operatively connected to said external input/output line;
an input buffer circuit operatively connected to said external input/output line and to said internal input line; and
an output buffer circuit, operatively connected to said internal output line and to said external input/output line, comprising:
a pull-up load operatively connected to said first power supply and to said external output line;
a first transistor having a drain operatively connected to said external input/output line, a source operatively connected to said second power supply and a gate operatively connected to said internal output line; and
means, operatively connected to said internal output line and to said external input/output line, for charging said external input/output line for a predetermined time-period when a state of said first transistor is changed from an on-state to an off-state, said means for charging comprising:
a second transistor having a drain operatively connected to said first power supply, a source operatively connected to said external input/output line and a gate;
a third transistor having a drain operatively connected to the gate of said second transistor, a source operatively connected to said second power supply, and a gate operatively connected to said internal output line; and
a delay circuit operatively connected between said internal output line and the gate of said second transistor.

7. A bidirectional input/output circuit as set forth in claim 6, wherein said pull-up load comprises a depletion type source-gate connected transistor operatively connected between said first power supply and said external input/output line.

8. A bidirectional input/output circuit as set forth in claim 6, wherein said delay circuit comprises:
a first inverter circuit having an input operatively connected to said internal output line and having an output;
a capacitor having an electrode operatively connected to the output of said first inverter circuit and having another electrode operatively connected to said second power supply; and
a second inverter circuit having an input operatively connected to the output of said first inverter circuit and having an output operatively connected to the gate of said second transistor.

9. A bidirectional input/output circuit as set forth in claim 8, wherein each of said first and second inverter circuits comprises a depletion type transistor and an enhancement type transistor connected in series.

10. A bidirectional input/output circuit as set forth in claim 8, wherein said first, second and third transistors are of an enhancement type.

11. A bidirectional input/output circuit as set forth in claim 6, wherein said input buffer circuit comprises a third inverter circuit having an input operatively connected to said external input/output line and having an output operatively connected to said internal input line.

12. A bidirectional input/output circuit as set forth in claim 11, wherein said third inverter circuit comprises a depletion type transistor and an enhancement type transistor connected in series.

13. A bidirectional input/output circuit as set forth in claim 7, wherein said bidirectional input/output circuit is incorporated into each of the input/output ports of a one-chip microcomputer.

14. An output buffer circuit having an external output line and operatively connectable to receive an internal output signal, comprising:
a buffer circuit operatively connected to the external output line and operatively connectable to receive the internal output signal; and
means, operatively connected to the external output line and operatively connectable to receive the internal output signal, for charging the external output line for a predetermined time period in dependence upon the internal output signal, said means for charging comprising:
a charging circuit operatively connected to the external output line;
a circuit, operatively connected to said charging circuit, for activating said charging circuit in dependence upon the internal output signal; and
a delay circuit, operatively connected to said charging circuit, for deactivating said charging circuit in dependence upon the internal output signal.

15. A bidirectional input/output circuit having an external input/output line and operatively connectable to receive an internal output signal, comprising:
an input buffer circuit operatively connected to the external input/output line; and
an output buffer circuit, operatively connected to the external input/output line and operatively connectable to receive the internal output signal, including:
a buffer circuit operatively connected to the external input/output line and operatively connectable to receive the internal output signal; and
means, operatively connected to the external input/output line and operatively connectable to receive the internal output signal, for charging the external input/output line for a predetermined time period in dependence upon the internal output signal, said means for charging comprising:
a charging circuit operatively connected to the external input/output line;
a circuit, operatively connected to said charging circuit, for activating said charging circuit in dependence upon the internal output signal; and
a delay circuit, operatively connected to said charging circuit, for deactivating said charging circuit in dependence upon the internal output signal.

* * * * *

UNITED STATES PATENT AND TRADEMARK OFFICE
CERTIFICATE OF CORRECTION

PATENT NO. : 4,479,067

DATED : October 23, 1984

INVENTOR(S) : Fujita

It is certified that error appears in the above-identified patent and that said Letters Patent is hereby corrected as shown below:

Col. 2, line 35, "The" should be --The output buffer circuit also includes a--.

Col. 5, line 52, "$C_{CC}$" should be --$V_{CC}$--.

Col. 6, line 61, "source gate" should be --source-gate--.

Signed and Sealed this

Sixteenth Day of April 1985

[SEAL]

Attest:

DONALD J. QUIGG

Attesting Officer

Acting Commissioner of Patents and Trademarks